(12) United States Patent
Peng et al.

(10) Patent No.: US 9,385,029 B2
(45) Date of Patent: Jul. 5, 2016

(54) METHOD FOR FORMING RECESS-FREE INTERCONNECT STRUCTURE

(71) Applicant: Taiwan Semiconductor Manufacturing Company, Ltd., Hsin-Chu (TW)

(72) Inventors: Chao-Hsien Peng, Zhubei (TW); Hsiang-Huan Lee, Jhudong Township (TW); Shau-Lin Shue, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/570,920

(22) Filed: Dec. 15, 2014

(65) Prior Publication Data

US 2015/0145134 A1    May 28, 2015

Related U.S. Application Data

(62) Division of application No. 13/791,272, filed on Mar. 8, 2013, now Pat. No. 8,912,041.

(51) Int. Cl.
*H01L 21/768* (2006.01)
*H01L 23/532* (2006.01)
*H01L 23/522* (2006.01)

(52) U.S. Cl.
CPC .... *H01L 21/76829* (2013.01); *H01L 21/76831* (2013.01); *H01L 21/76835* (2013.01); *H01L 21/76838* (2013.01); *H01L 21/76867* (2013.01); *H01L 21/76868* (2013.01); *H01L 21/76885* (2013.01); *H01L 23/5226* (2013.01); *H01L 23/53233* (2013.01); *H01L 23/53238* (2013.01); *H01L 23/53295* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 6,797,642 B1 * | 9/2004 | Chu | C23C 14/5826 257/E21.582 |
| 2012/0244698 A1 * | 9/2012 | Ryan | H01L 21/76834 438/653 |

* cited by examiner

*Primary Examiner* — Yasser A Abdelaziez
(74) *Attorney, Agent, or Firm* — Slater Matsil, LLP (57) ABSTRACT

A method for forming an interconnect structure includes forming a dielectric material layer on a semiconductor substrate. An oxygen-rich layer is formed over the dielectric material layer. The dielectric material layer and the oxygen-rich layer are patterned to form a plurality of vias in the semiconductor substrate. A barrier layer is formed in the plurality of vias and on the dielectric material layer leaving a portion of the oxygen-rich layer exposed. A metal layer is formed on the bather layer and on the exposed portion of the oxygen-rich layer, wherein the metal layer fills the plurality of vias. The semiconductor substrate is annealed at a predetermined temperature range and at a predetermined pressure to transform the exposed portion of the oxygen-rich layer into a metal-oxide stop layer.

20 Claims, 6 Drawing Sheets

METHOD FOR FORMING RECESS-FREE INTERCONNECT STRUCTURE

PRIORITY CLAIM

This application is a divisional of and claims priority to U.S. patent application Ser. No. 13/791,272, filed Mar. 8, 2013, and entitled "Method for Forming Recess-Free Interconnect Structure," which application is incorporated herein by reference.

BACKGROUND

When fabricating semiconductor devices, for electrical connection between elements or lines, metal lines are used. In recent years, as semiconductor devices are required to have higher integration and higher performance, copper (Cu), having excellent electrical properties such as conductivity, is used as the material of choice to form the metal lines.

A copper metal line is not easy to pattern through an etching process, such as subtractive patterning process used to form aluminum metal lines, and so it is patterned through a damascene process. In a multi-line structure, a damascene process of forming a via connecting upper/lower lines and an upper metal line at the same time has widely been used.

Figure 1:
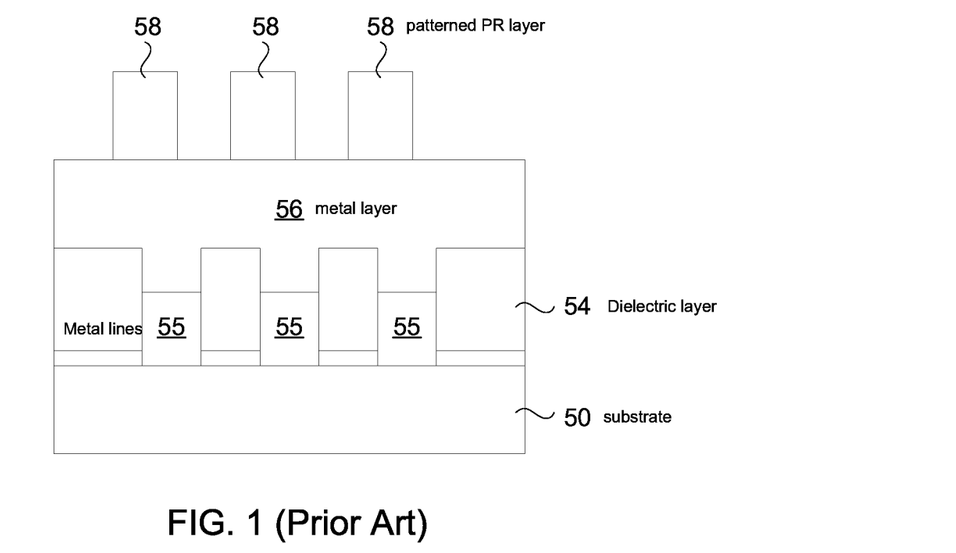
FIGS. 1 and 2 are cross-sectional views of a part of an interconnect structure of a semiconductor device from the prior art.

FIG. 1 is a cross-sectional view of part of a simplified interconnect structure formed on a semiconductor device from the prior art. In the figure, a patterned dielectric layer 54 is formed on an upper surface of a semiconductor substrate 50. Formed between the openings of the patterned dielectric layer 54 are metal lines 55. A metal layer 56 made of copper, for instance is formed above the metal lines 55 and the patterned dielectric layer 54. In a later process, the metal layer will be etched to form metal vias above the lower metal lines 55. Though not shown in FIG. 1, a thin layer of bather metal film may be deposited and formed on the inner walls of the metal lines 55 and/or metal vias. The barrier metal film functions to prevent copper atoms from diffusing into the dielectric layer 54 when metal lines and/or metal vias are formed. Also shown in FIG. 1 is a patterned photoresist layer 58 formed on metal layer 56 through a typical photolithography process. The photolithography process may comprise a series of processes, such as photoresist coating, exposure, and development.

Figure 2:
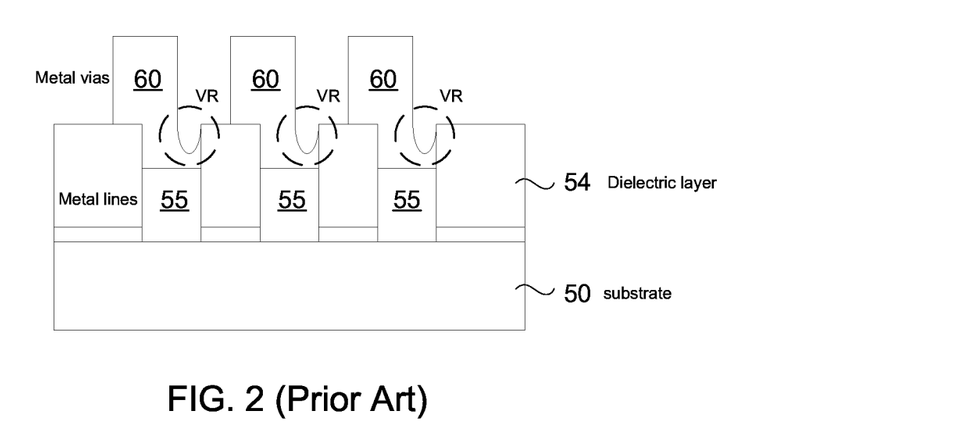

The conventional copper metal line formation method can have a number of problems however. One problem may be misalignment. In the process of device feature or pattern exposure, the alignment between successive layers that are being created is of critical importance. Smaller device dimensions place even more stringent requirements on the accuracy of the alignment of the successive layers that are superimposed on each other. In FIG. 2, following the etching of the metal layer 56 in which the patterned photoresist layer 58 is used as mask to form metal vias 60, via recesses VR may be formed at the juncture of a metal via 60 and a respective one of the lower metal line. Via recesses can be caused when the metal via 60 in contact with a respective one of the lower metal line are misaligned (e.g., shifted to one side) relative to the lower metal line. Such misalignment can result from a mask misalignment failure, for example, during the photolithography process. Due to this misalignment, the via recess formed can be a serious problem in the conventional copper etch approach by causing unstable yield and decreased device reliability.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are intended for illustration.

Figure 3:
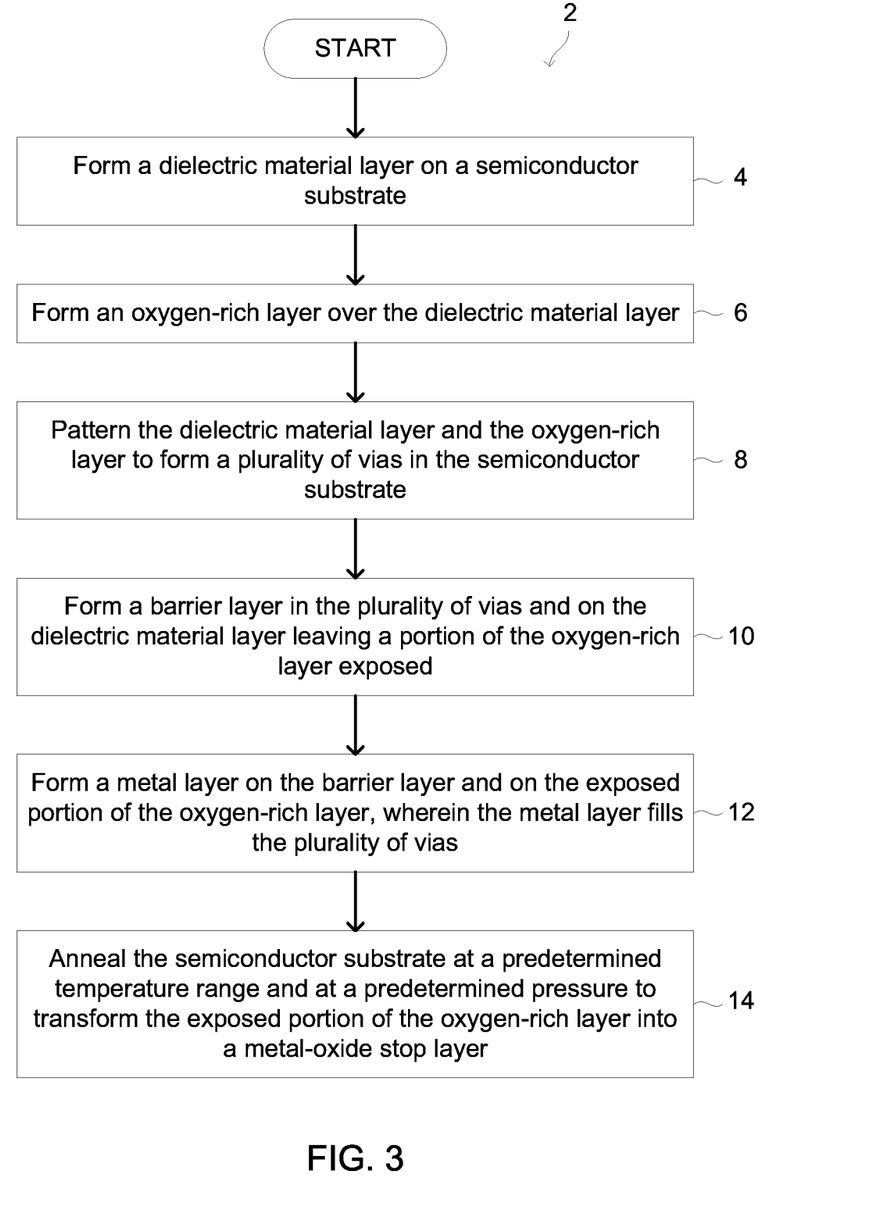
FIG. 3 is a flowchart of a method of fabricating an interconnect structure of a semiconductor device according to various embodiments of the present disclosure.

FIG. 3 is a flowchart of a method 2 for fabricating an interconnect structure of a semiconductor device according to various aspects of the present disclosure. Referring to FIG. 3, the method 2 includes block 4, in which a dielectric material layer is formed on a semiconductor substrate. The method 2 includes block 6, in which an oxygen-rich layer is formed over the dielectric material layer. The method 2 includes block 8, in which the dielectric material layer and the oxygen-rich layer are patterned to form a plurality of vias in the semiconductor substrate. The method 2 includes block 10, in which a barrier layer is formed in the plurality of vias and on the dielectric material layer leaving a portion of the oxygen-rich layer exposed. The method 2 includes block 12, in which a metal layer is formed on the barrier layer and on the exposed portion of the oxygen-rich layer, wherein the metal layer fills the plurality of vias. The method 2 includes block 14, in which the semiconductor substrate is annealed at a predetermined temperature and at a predetermined pressure to transform the exposed portion of the oxygen-rich layer into a metal-oxide stop layer.

It is understood that additional processes may be performed before, during, or after the blocks 4-14 shown in FIG. 3 to complete the fabrication of the interconnect structure, but these additional processes are not discussed herein in detail for the sake of simplicity.

FIGS. 4-9 are cross-sectional side views of a part of an interconnect structure at various fabrication stages according to embodiments of the method 2 of FIG. 3. It is understood that FIGS. 4-9 have been simplified for a better understanding of the inventive concepts of the present disclosure. It should be appreciated that the materials, geometries, dimensions, structures, and process parameters described herein are exemplary only, and are not intended to be, and should not be construed to be, limiting to the invention claimed herein. Many alternatives and modifications will be apparent to those skilled in the art, once informed by the present disclosure.

Figure 4:
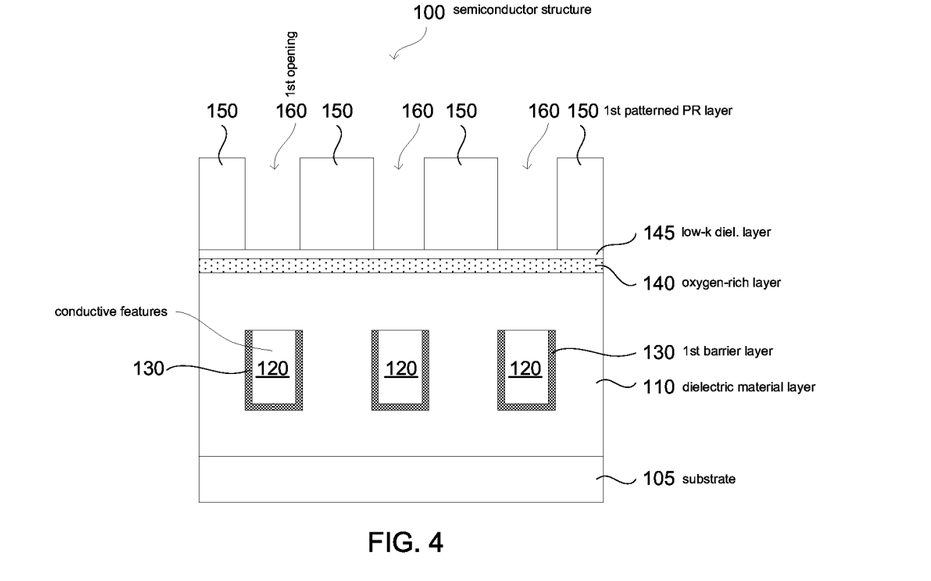
FIGS. 4-10 are cross-sectional side views of a part of an interconnect structure of a semiconductor device at various stages of fabrication in accordance with various embodiments of the present disclosure.

Referring to FIG. 4, a semiconductor structure 100 on a substrate 105 is provided. The semiconductor substrate 105 includes silicon. Alternatively or additionally, the substrate 105 may include other elementary semiconductor such as germanium. The substrate 105 may include a compound semiconductor such as silicon carbide, gallium arsenic, indium arsenide, and indium phosphide. The substrate 105 may include an alloy semiconductor such as silicon germanium, silicon germanium carbide, gallium arsenic phosphide, and gallium indium phosphide. In one embodiment, the substrate 105 includes an epitaxial layer. For example, the substrate may have an epitaxial layer overlying a bulk semiconductor. Furthermore, the substrate 105 may include a semiconductor-on-insulator (SOI) structure. For example, the substrate may include a buried oxide (BOX) layer formed by a process such as separation by implanted oxygen (SIMOX) or other suitable techniques, such as wafer bonding and grinding. The substrate 105 also includes various p-type doped regions and/or n-type doped regions, implemented by a process such as ion implantation and/or diffusion. Those doped regions include n-well, p-well, lightly doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 105 may further include other functional features such as a resistor or a capacitor formed in and on the substrate. The substrate 105 further includes lateral isolation features provided to separate various devices formed in the substrate 105. In one embodiment, shallow trench isolation (STI) features are used for lateral isolation. The various IC devices may further include other features, such as silicide disposed on S/D and gate stacks overlying channels.

The semiconductor structure 100 may also include a plurality of dielectric layers and conductive features integrated to form an interconnect structure configured to couple the various p-type and n-type doped regions and the other functional features (such as gate electrodes), resulting in a functional integrated circuit. In one example, the semiconductor structure 100 may include a portion of the interconnect structure and is collectively referred to as the substrate 105. The semiconductor structure is further described later.

As noted above, the semiconductor structure 100 includes an interconnect structure. The interconnect structure includes a multi-layer interconnect (MLI) structure and an inter-level dielectric (ILD) integrated with the MLI structure, providing an electrical routing to couple various devices in the substrate 105 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

Exemplary conductive features 120 are shown in FIG. 4 for illustration. In one embodiment, the conductive features 120 include a portion of the interconnect structure, the conductive features 120 being formed in a dielectric material layer 110. For example, the conductive features 120 include a contact, a metal via, or a metal line. In this case, the conductive features 120 may be further surrounded by a first barrier layer 130 to prevent diffusion and/or provide material adhesion. The conductive features 120 may include aluminum (Al); copper (Cu) or tungsten (W). The first barrier layer 130 may include titanium nitride (TiN), tantalum nitride (TaN), tungsten nitride (WN), titanium silicon nitride (TiSiN) or tantalum silicon nitride (TaSiN). The conductive features 120 and the first barrier layer 130 may be formed by a procedure including lithography, etching and deposition. In another embodiment, the conductive features 120 include an electrode of a capacitor, a resistor or a portion of a resistor. Alternatively, the conductive features 120 include a doped region (such as a source or a drain), or a gate electrode. In another example, the conductive features 120 are silicide features disposed on respective source, drain or gate electrode. The silicide feature may be formed by a self-aligned silicide (salicide) technique.

The dielectric material layer 110 may include one dielectric material layer, such as silicon oxide, silicon nitride, a dielectric material layer having a dielectric constant (k) lower than thermal silicon oxide (thereafter referred to as low-k dielectric material layer), or some other suitable dielectric material layer. In various examples, the low k dielectric material may include fluorinated silica glass (FSG), carbon doped silicon oxide, Xerogel, Aerogel, amorphous fluorinated carbon, Parylene, BCB (bis-benzocyclobutenes), SiLK (Dow Chemical, Midland, Mich.), polyimide, and/or other materials as examples. In another example, the low k dielectric material may include an extreme low k dielectric material (XLK). In another example, the low k dielectric material layer includes a porous version of an existing Dow Corning dielectric material called FOX (flowable oxide) which is based on hydrogen silsesquioxane. A process of forming the dielectric material layer 110 may utilize spin-on coating or chemical vapor deposition (CVD). In one example, a chemical mechanical polishing (CMP) process may be used to further planarize the top surface of the dielectric material layer 110.

Still referring to FIG. 4, an oxygen-rich layer 140 is formed on the dielectric material layer 110. The oxygen-rich layer 140 may be formed by a process such as for example, chemical vapor deposition (CVD), physical vapor deposition (PVD), and atomic layer deposition (ALD). In an exemplary embodiment, the oxygen-rich layer 140 comprises an oxide layer having oxygen elements present and has a thickness less than about 5 nm. In some embodiments, a low-k dielectric layer 145 is formed on the oxygen-rich layer 140 having a thickness of less than about 2 nm.

Also illustrated in FIG. 4 is a first patterned photoresist layer 150 formed on the oxygen-rich layer 140, or in some embodiments on the low-k dielectric layer 145. The first patterned photoresist layer 150 includes various first openings 160 that define portions of the dielectric material layer 110 for vias and expose those portions for subsequent etch. Particularly, the first openings 160 are aligned with respective conductive features 120. In one embodiment, the first patterned photoresist layer 150 is formed by a procedure including coating, exposure, post-exposure baking, and developing. Particularly, the resist coating may utilize spin-on coating. In one example of the exposure, the coated resist layer is selectively exposed by radiation beam through a mask having a predefined pattern. The radiation beam includes ultraviolet (UV) light in one example. The exposing process may be further extended to include other technologies such as a maskless exposing or writing process. After the exposing process, the first photoresist layer 150 is further processed by a thermal baking process, referred to as a post exposure bake (PEB). The PEB may induce a cascade of chemical transformations in the exposed portion of the resist layer, which is transformed to have an increased solubility of the resist in a developer. Thereafter, the resist layer on the substrate is developed such that the exposed resist portion is dissolved and washed away during the developing process. Thus the resist layer is patterned to have one or more first openings 160 as illustrated in FIG. 4. The lithography processes described above may only present a subset of processing steps associated with a lithography patterning technique. The lithography process may further include other steps such as cleaning and baking in a proper sequence. For example, the developed resist layer may be further baked, referred as hard baking.

Figure 5:
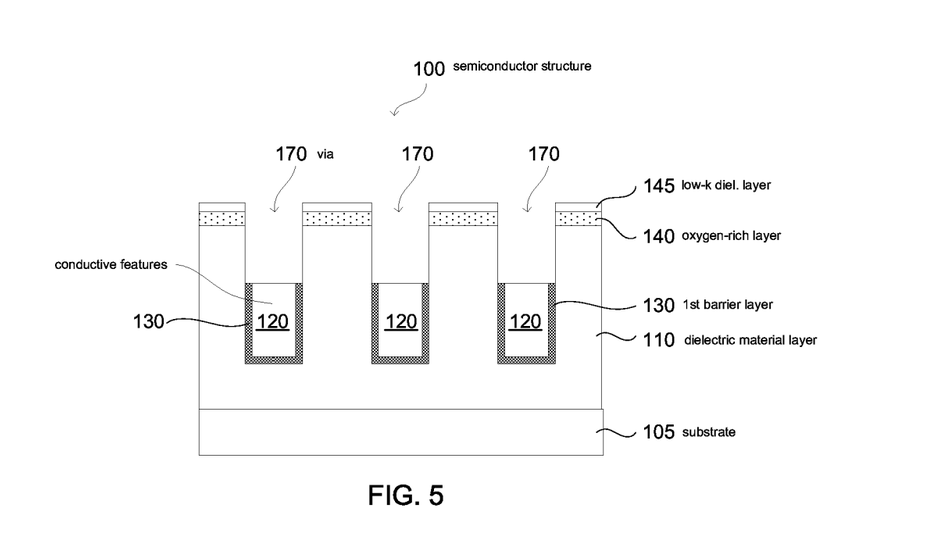

As illustrated in FIG. 5, the low-k dielectric layer 145, the oxygen-rich layer 140 and the dielectric material layer 110 are etched through the openings 160 of the patterned photoresist layer 150 using the patterned photoresist layer 150 as an etch mask, resulting in one or more vias 170 in the dielectric material layer 110 such that the respective conductive features 120 are at least partially exposed within the vias 170. The dielectric material layer 110 exposed within the openings 160 of the patterned photoresist layer 150 is removed by an etch technique such as dry etch, wet etch, or combinations thereof. In one example, the etch process utilizes a medium-density plasma etch system using capacitively coupled plasmas, or a high-density plasma etch system that utilizes either inductive, helicon, or electron cyclotron resonance (ECR) plasmas, wherein the exposed dielectric material is anisotropically removed by fluorocarbon plasma, forming the vias 170, as illustrated in FIG. 5. Other dry-etch process may be alternatively used. The mechanism of etching in each dry-etch process may have a physical basis (e.g., glow-discharge sputtering, or ion milling) or a chemical basis (e.g., in pure plasma etching) or a combination of both (e.g., reactive ion etching or RIE). Sputtering relies on directional nature of the incident energetic ions to etch in a highly anisotropic manner. Pure plasma etching, a chemical basis etching, may achieve a very high selectivity against both mask material and underlying layers and typically etches in an anisotropic fashion. By combining both physical and chemical mechanism etch offers a controlled anisotropic etch with adequate selectivity. Thereafter, the patterned photoresist layer 150 may be removed by a process such as wet stripping or O2 plasma ashing. In another example, a hard mask may be utilized as an etch mask during the etch process to pattern the dielectric material layer 110.

Figure 6:
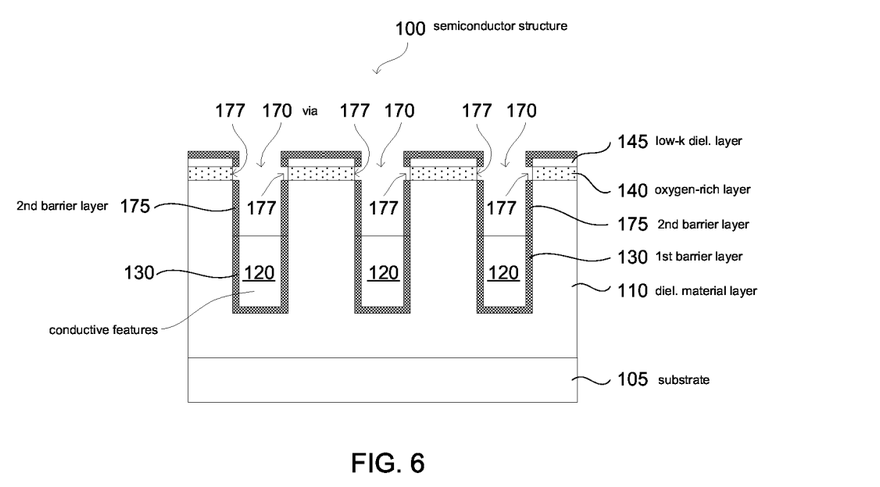

Referring now to FIG. 6, a second barrier layer 175 is formed in the vias 170, as well as on top of the low-k dielectric layer 145 but not over portions 177 of the oxygen-rich layer 140 leaving those portions of the oxygen-rich layer 140 exposed. The exposed portions 177 of the oxygen-rich layer 140 are disposed at respective via and trench junctures of the damascene or interconnect structure of the semiconductor device 100. In one embodiment, the second barrier layer 175 includes metal and is electrically conductive but does not permit inter-diffusion and reactions between the dielectric material layer 110 and a metal layer to be filled in the vias 170. The second barrier layer 175 may include refractory metals and their nitrides. In various examples, the second barrier layer 175 includes TiN, TaN, Co, WN, TiSiN, TaSiN, or combinations thereof. The second barrier layer 175 may include multiple films. For example, Ti and TiN films are used as the second barrier layer. The second barrier layer 175 may be deposited by selective deposition processes such as physical vapor deposition (PVD), chemical vapor deposition (CVD), metal-organic chemical vapor deposition (MOCVD), and atomic layer deposition (ALD), or other suitable selective deposition techniques.

Figure 7:
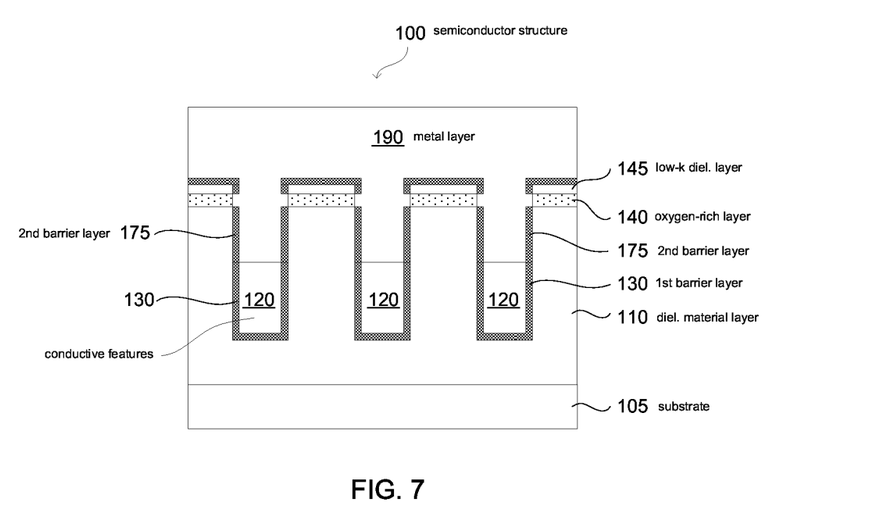

Referring now to FIG. 7, a metal layer 190 is formed on the second barrier layer 175 and on the exposed portions 177 of the oxygen-rich layer 140, wherein the metal layer 190 fills the vias 170. The metal layer 190 may include copper (Cu), aluminum (Al), tungsten (W), or other suitable conductive materials. In an exemplary embodiment with enhanced etch effect, the metal layer includes copper or copper alloy, such as copper magnesium (CuMg), copper aluminum (CuAl), copper silicon (CuSi), copper manganese (CuMn), copper titanium (CuTi), copper tungsten (CuW), copper tantalum (CuTa), copper zirconium (CuZr), or copper molybdenum (CuMo). In furtherance of the exemplary embodiment, the Mn concentration of the copper magnesium alloy ranges between about 0.5% and about 2% in weight. In one embodiment, the metal layer 190 includes a copper layer deposited by PVD. In one embodiment, the metal layer 190 includes a copper seed layer deposited by PVD and bulk copper layer by plating. In various other examples, copper deposition may be implemented by other techniques, such as PVD, CVD, MOCVD, or plating. A copper reflow process may be added to enhance the copper filling profile. In some embodiments, the metal layer 190 may be planarized by a chemical mechanical polishing (CMP) or an etch back step, for example.

Figure 8:
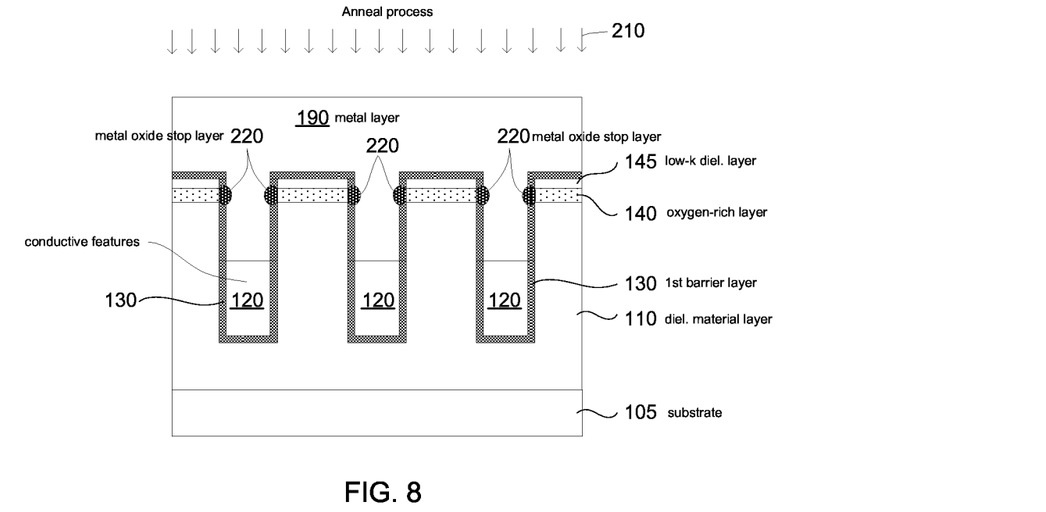

In an aspect of the present disclosure, a metal oxide stop layer 220 is formed by copper alloy segregating from the metal layer 190 to the surface thereof at the exposed portions 177 of the oxygen-rich layer 140 in an anneal process 210, as shown in FIG. 8. The metal oxide stop layer or metal oxide etch stop layer 220 functions as a stop layer to stop the etching of the metal layer 190 from etching below the metal oxide stop layer 220 in a later process. Subjecting the semiconductor device 100 to the anneal process 210, metal elements as well as metal oxide (oxygen being present in the oxygen-rich layer 140) providing a good etch stop layer will segregate to the surface of metal layer 190 at the exposed portions 177 of the oxygen-rich layer 140. According to an exemplary embodiment, metal elements such as, for example Mn, Al, Mg, Ta, Zr, Ti, W, and Mo segregates to the surface of the metal layer 190 at the exposed portions 177 when the semiconductor device 100 undergoes a thermal anneal at a temperature in the range from about 150 C to about 400 C, at a pressure of about 1 Torr to about 760 Torr in a gas such as, for example N2, N2/H2, N2/O2, or Ar.

Figure 9:
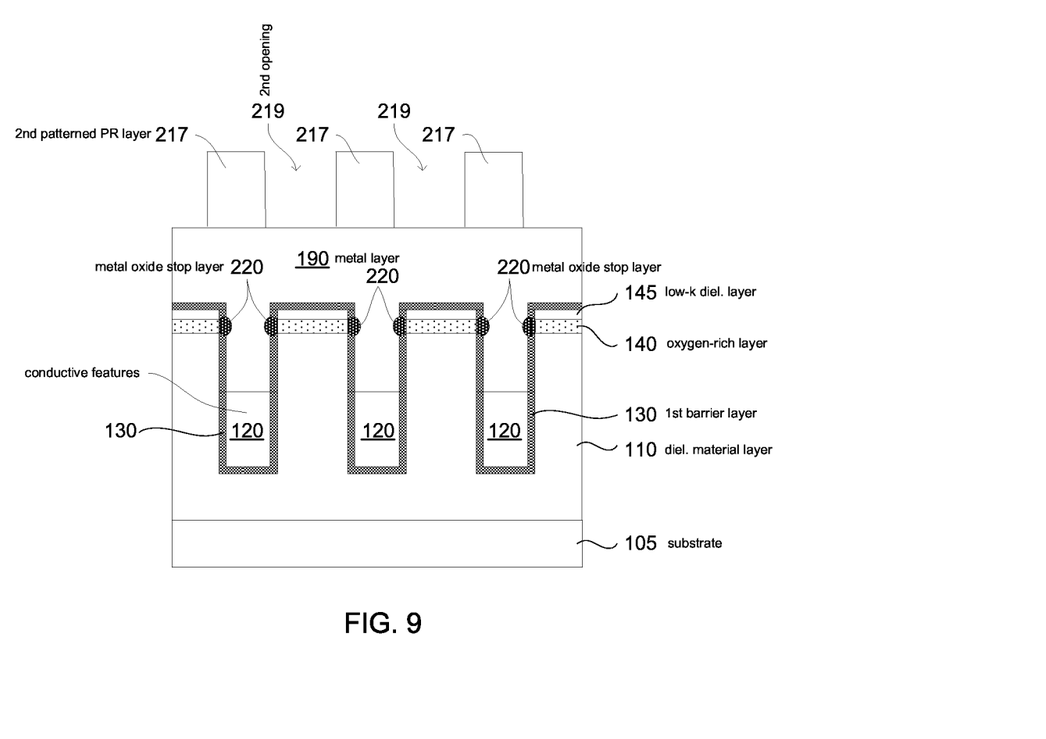

With reference now to FIG. 9, a second patterned photoresist layer 217 having second openings 219 is formed on the metal layer 190. The lithography technique to form the second patterned photoresist layer 217 is similar to the method discussed above for forming the first patterned photoresist layer 150 and so will not be described again. The second patterned photoresist layer 217 is formed on the metal layer 190 as an etch mask having second openings 219 that exposes the regions of the metal layer 190 to be removed.

The metal etch process is implemented using plasma etch, in one embodiment. Usually, copper is considered to be difficult to etch in plasma etching processes due to it forming an etch product with chlorine-CuCl, which is relatively nonvolatile below a certain temperature range. Thus copper may not be plasma etched with any one of the etchant gases containing chlorine. Therefore, copper etch may not be achieved by a traditional subtractive etching approach used to form aluminum metal lines. So to overcome the nonvolatile copper compound and apply an appropriate gas combination has become a challenging task for copper plasma etch. In one embodiment, the etch gas includes carbon, hydrogen, oxygen and nitrogen. In another embodiment, the copper etch gas applied to copper plasma etch includes a hydrogen containing gas, such as $C_xH_y$, $C_xF_y$, $C_xH_yF_z$, or combinations thereof. The subscript x, y, or z has a value greater than 0 and less than 6. The subscripts x, y, and z may be omitted for simplicity in the following description. In this embodiment, the copper etch gas applied in Cu plasma etch further includes at least one of CO and $O_2$, and at least one of $N_2$ and Ar. In a particular example, the gas flows for the hydrogen containing gas ranges between about 1 sccm and about 100 sccm; the gas flow of CO (or $O_2$) ranges between about 1 sccm and about 500 sccm; and the gas flow of $N_2$ (or Ar) ranges between about 1 sccm and about 1000 sccm. In furtherance of the present example, the plasma etch temperature (substrate temperature) is within a range of about 20 C and about 250 C. In another example, the plasma etch temperature is within a range of about 20 C and about 80 C. Experiments have been conducted that show that the CuMn alloy has a higher etch rate. Some of these experiments further show that the etch rate is about 1.5 to 3 times of the etch rate of the copper metal layer without magnesium content.

The method to pattern the metal layer 190 is described above, and other embodiments are present. In one embodiment, a wet etch process may be alternatively or additionally used to pattern the metal layer 190. In yet another embodiment, when the metal layer 190 includes other suitable metal, such as aluminum or tungsten, other etch gas may be used. In yet another embodiment, a hard mask, such as silicon oxide, silicon carbide, silicon nitride, titanium nitride, or tantalum nitride may be formed as an etch mask by a procedure including lithography and etching.

Figure 10:
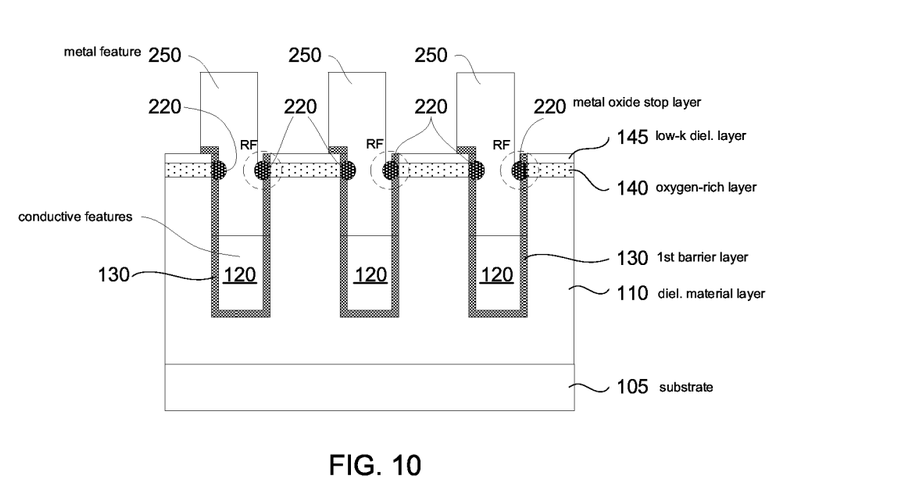

The metal layer 190 is etched such that portions thereof above the low-k dielectric layer 145 are patterned to form a plurality of metal features 250, as shown in FIG. 10. Metal features 250 may be metal lines, metal vias, or via features to provide vertical electrical routing between metal lines, in one embodiment. In one embodiment, each of the metal features 250 is substantially aligned with a respective one of the plurality of the conductive features 120. The etching stops at the metal-oxide stop layers 220 and does not etch into the underlying layers such as the metal layer 190 under the metal features 250, thus avoiding undesirable recesses. Even in the embodiment as shown in FIG. 10, where the metal features 250 are in contact with the underlying metal layer 190 but due to misalignment offset a bit (e.g., shifted to one side) relative to the underlying metal layer 190, the metal oxide stop layers 220 prevent the underlying metal layer 190 from being etched, resulting in a recess free (RF) semiconductor structure 100.

The present disclosure has described various exemplary embodiments. According to one embodiment, a method for forming an interconnect structure includes forming a dielectric material layer on a semiconductor substrate. An oxygen-rich layer is formed over the dielectric material layer. The dielectric material layer and the oxygen-rich layer are patterned to form a plurality of vias in the semiconductor substrate. A barrier layer is formed in the plurality of vias and on the dielectric material layer leaving a portion of the oxygen-rich layer exposed. A metal layer is formed on the barrier layer and on the exposed portion of the oxygen-rich layer, wherein the metal layer fills the plurality of vias. The semiconductor substrate is annealed at a predetermined temperature range and at a predetermined pressure to transform the exposed portion of the oxygen-rich layer into a metal-oxide stop layer.

According to another embodiment, a method for forming an interconnect structure includes providing a plurality of conductive features in a semiconductor substrate. A dielectric material layer is formed over the conductive features. An oxygen-rich oxide layer is formed over the dielectric material layer. The dielectric material layer and the oxygen-rich oxide layer are patterned to form a plurality of vias in the semiconductor substrate, wherein each of the plurality of vias is substantially aligned with a respective one of the plurality of conductive features. A barrier layer is formed in the plurality of vias and on the dielectric material layer leaving a portion of the oxygen-rich oxide layer exposed. A copper alloy layer is formed on the barrier layer and on the exposed portion of the oxygen-rich oxide layer, wherein the copper alloy layer fills the plurality of vias. The semiconductor substrate is annealed to segregate metal oxide to the surface of the copper alloy layer to form a metal-oxide etch stop layer.

According to yet another embodiment, a semiconductor structure includes a plurality of conductive features embedded in a dielectric material layer on a semiconductor substrate. The structure further includes a plurality of metal features embedded in the dielectric material layer, wherein each of the plurality of metal features is substantially aligned with a respective one of the plurality of conductive features. The structure also includes a metal-oxide stop layer disposed at the via and trench juncture of each of the plurality of metal features.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A method, comprising:
   forming a dielectric material layer on a semiconductor substrate;
   forming an oxygen-rich layer over the dielectric material layer;
   patterning the dielectric material layer and the oxygen-rich layer to form a plurality of vias in the semiconductor substrate;
   forming a barrier layer in the plurality of vias and on the dielectric material layer leaving a portion of the oxygen-rich layer exposed;
   forming a metal layer on the barrier layer and on the exposed portion of the oxygen-rich layer, wherein the metal layer fills the plurality of vias; and
   annealing the semiconductor substrate at a predetermined temperature range and at a predetermined pressure to transform the exposed portion of the oxygen-rich layer into a metal-oxide stop layer.

2. The method of claim 1, wherein the oxygen-rich layer is formed from a process selected from the group consisting of chemical vapor deposition (CVD), physical vapor deposition (PVD), and atomic layer deposition (ALD).

3. The method of claim 1, further comprising forming a low-k dielectric layer over the oxygen-rich layer prior to the patterning of the dielectric material layer and the oxygen-rich layer to form the plurality of vias.

4. The method of claim 3, wherein the low-k dielectric layer has a thickness of less than about 2 nm.

5. The method of claim 1, wherein the oxygen-rich layer comprises an oxygen-rich oxide layer.

6. The method of claim 1, wherein the portion of the oxygen-rich layer exposed is disposed around the via and trench portion of the semiconductor substrate.

7. The method of claim 1, wherein the forming the metal layer includes forming a copper-containing material selected from the group consisting of copper (Cu), copper magnesium (CuMg), copper aluminum (CuAl), copper manganese (CuMn), copper titanium (CuTi), copper silicon (CuSi), copper tungsten (CuW), copper tantalum (CuTa), copper zirconium (CuZr), copper molybdenum (CuMo), and combinations thereof.

8. The method of claim 1, wherein the semiconductor substrate is annealed at a temperature from about 150 C to about 400 C, at a pressure of about 1 Torr to about 760 Torr in a gas comprising N2, N2/H2, N2/O2, or Ar.

9. The method of claim 1, further comprising etching the metal layer such that portions of the metal layer above the oxygen-rich layer are patterned to form a plurality of metal features, wherein the metal-oxide stop layer stops the etching of the metal layer below the metal features.

10. The method of claim 9, wherein at least one of the plurality of metal features is misaligned to a corresponding conductive feature below the plurality of metal features.

11. A method, comprising:
    forming a dielectric material layer on a semiconductor substrate;
    forming an oxygen-rich layer over the dielectric material layer;
    patterning the dielectric material layer and the oxygen-rich layer to form an opening therein;
    forming a barrier layer selectively within the opening, wherein the barrier layer leaves exposed a portion of the oxygen-rich layer within the opening;
    depositing a metal layer within the opening, in contact with the barrier layer and with the exposed portion of the oxygen-rich layer; and
    annealing the metal layer and the oxygen-rich layer to transform the exposed portion of the oxygen-rich layer into a metal-oxide stop layer.

12. The method of claim 11, further comprising: forming an underlying conductive feature in the dielectric layer.

13. The method of claim 11, wherein the step of forming an oxygen-rich layer comprises depositing an oxide layer using a deposition process selected from the group consisting of chemical vapor deposition, physical vapor deposition, and atomic layer deposition.

14. The method of claim 11, wherein the step of forming a barrier layer selectively within the opening comprises depositing a refractory metal nitride on the dielectric layer.

15. The method of claim 12, further comprising:
    forming a masking layer over the metal layer; and
    etching the metal layer to form a patterned metal layer.

16. The method of claim 12, wherein the opening is misaligned to the underlying conductive feature.

17. The method of claim 16 wherein a portion of the patterned metal layer is in contact with the underlying conductive feature and a portion of the patterned metal layer overlies the dielectric layer adjacent to the underlying conductive feature.

18. The method of claim 11, further comprising forming a low-k dielectric layer over the oxygen-rich layer prior to the patterning of the dielectric material layer and the oxygen-rich layer.

19. A semiconductor device, comprising:
    a plurality of conductive features embedded in a dielectric material layer on a semiconductor substrate;
    a plurality of metal features at least partially embedded in the dielectric material layer, wherein at least one of the plurality of metal features is distinct from, overlying, and substantially aligned with a respective one of the plurality of conductive features and wherein the at least one of the plurality of metal features includes a via portion within the dielectric material layer and a trench portion above the dielectric material layer; and
    a metal-oxide stop layer disposed at a juncture of the via portion and trench portion of each of the at least one of the plurality of metal features.

20. The semiconductor device of claim 19, wherein the plurality of metal features includes a copper-containing material selected from the group consisting of copper (Cu), copper magnesium (CuMg), copper aluminum (CuAl), copper manganese (CuMn), copper titanium (CuTi), copper silicon (CuSi), copper tungsten (CuW), copper tantalum (CuTa), copper zirconium (CuZr), copper molybdenum (CuMo), and combinations thereof.

* * * * *